(12) United States Patent
Sridhar et al.

(10) Patent No.: US 8,940,631 B1
(45) Date of Patent: Jan. 27, 2015

(54) METHODS OF FORMING COAXIAL FEEDTHROUGHS FOR 3D INTEGRATED CIRCUITS

(71) Applicants: Uppili Sridhar, Morgan Hill, CA (US); Albert Bergemont, Palo Alto, CA (US)

(72) Inventors: Uppili Sridhar, Morgan Hill, CA (US); Albert Bergemont, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 7 days.

(21) Appl. No.: 13/843,608

(22) Filed: Mar. 15, 2013

(51) Int. Cl.
*H01L 21/4763* (2006.01)
*H01L 21/48* (2006.01)

(52) U.S. Cl.
CPC .................... *H01L 21/486* (2013.01)
USPC ......................................... 438/618; 438/597

(58) Field of Classification Search
USPC ........................................ 438/597, 618, 622
See application file for complete search history.

(56) References Cited

U.S. PATENT DOCUMENTS

| 7,851,897 | B1 | 12/2010 | Cate et al. | |
|---|---|---|---|---|
| 8,264,089 | B2 | 9/2012 | Alvarado et al. | |
| 2010/0187557 | A1* | 7/2010 | Samoilov et al. | 257/99 |
| 2011/0227219 | A1 | 9/2011 | Alvarado et al. | |
| 2011/0248398 | A1 | 10/2011 | Parvarandeh et al. | |
| 2012/0258589 | A1* | 10/2012 | Volant et al. | 438/653 |
| 2012/0326308 | A1 | 12/2012 | Alvarado et al. | |
| 2013/0071983 | A1* | 3/2013 | Ellul et al. | 438/381 |

OTHER PUBLICATIONS

Ho, Soon W., et al., "High RF Performance TSV Silicon Carrier for High Frequency Application", *2008 Electronic Components and Technology Conference*, (2008), pp. 1946-1952.

* cited by examiner

*Primary Examiner* — Bradley K Smith
(74) *Attorney, Agent, or Firm* — Blakely Sokoloff Taylor & Zafman LLP

(57) ABSTRACT

Methods of forming coaxial feedthroughs for 3*d* integrated circuits that provide excellent isolation of signal paths from the substrate and from adjacent feedthroughs. One method is to form a recess in a substrate and deposit alternate layers of insulation and conductive layers and then thin the substrate to make the layers available from both sides of the substrate, with the first metal layer forming the coaxial conductor and the second metal layer forming the central conductor. Alternatively the coaxial feedthroughs may be formed using a modified pillar process to form the coaxial conductor at the same time as the center conductor is formed so that the coaxial feedthrough is formed without requiring extra steps. Both processes are low temperature processes.

13 Claims, 3 Drawing Sheets

METHODS OF FORMING COAXIAL FEEDTHROUGHS FOR 3D INTEGRATED CIRCUITS

BACKGROUND OF THE INVENTION

1. Field of the Invention

The present invention relates to the field of integrated circuit (IC) manufacturing.

2. Prior Art

Vertical feedthroughs are heavily used in 3D IC technologies wherein multiple ICs are stacked and packaged as a single circuit board device. Typical feedthroughs used in embedded wafer level or panel level packaging technologies use through silicon vias (TSVs) or holes drilled or etched through the substrate that are filled or lined with a metal layer that is insulated from the substrate. Feedthroughs are also currently made with Cu pillars in WLP (wafer level processing) technology. While these techniques provided for compact wiring, cross talk (inductive and capacitive) between densely pack TSVs (through silicon vias) is becoming a problem, in part because of the nature of the signals being transferred and in part because of the density of the feedthroughs needed to accommodate the number of such signals.

Feedthroughs are also currently made with Cu pillars in WLP (wafer level processing) technology and drilled vias filled with Cu are used in embedded wafer level or panel level packaging technologies.

The prior art solution addresses only coaxial through silicon vias to reduce inter TSV coupling. (See "High RF Performance TSV Silicon Carrier for High Frequency Application", Soon Wee Ho et al, 2008 Electronic Components and Technology Conference.) No mention of Coaxial connections using Cu pillar or embedded die technology has been found in the prior art.

Thus the problem to be solved is to eliminate or at least substantially reduce the electrical and magnetic cross talk between through vias commonly used in 3D integration technologies.

DETAILED DESCRIPTION OF THE PREFERRED EMBODIMENTS

Figure 1:
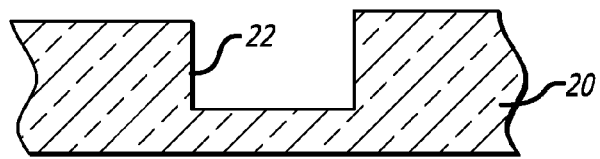
FIGS. 1-7 illustrate cross sections of a substrate during processing to form a coaxial feedthrough therein.
Figure 2:
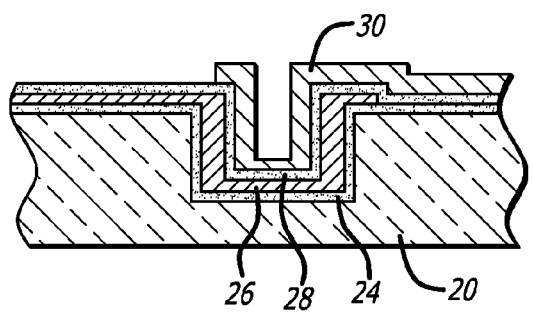

The present invention is perhaps best described through a description of exemplary methods of fabricating the same. Thus, first referring to FIG. 1, the initial steps in the exemplary process may be seen. This example is for providing coaxial feedthroughs in a silicon wafer 20, though is also applicable to other types of wafers or wafer size substrates as are well known in the art. The first step shown in FIG. 1 is to etch a recess 22 in the substrate 20 approximately 50-200 microns deep using a directional etch to provide substantially parallel sidewalls for the recess. Then an oxide liner 24 approximately 1 micron thick is deposited, followed by a TiN/Cu seed layer deposit, followed by a copper ground shield 26 approximately 1 micron thick that is patterned by a subsequent photomask and etch process. Then, as shown in FIG. 2, another oxide layer 28 is deposited to form the coax insulator of approximately 5-10 microns thick, and then finally another TiN/Cu seed layer, followed by the deposit and patterning of inner conductor 30 of copper approximately 5-10 microns thick. As shown, this final copper layer does not entirely fill the recess shown in FIG. 1, though alternatively the recess could be entirely filled if desired.

Figure 3:
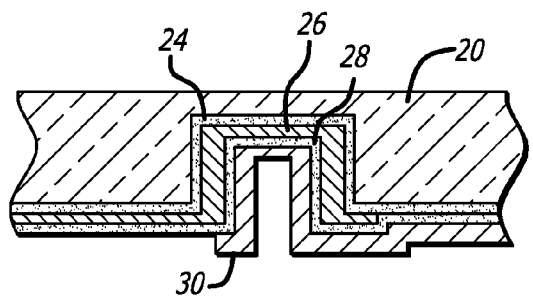
Figure 4:
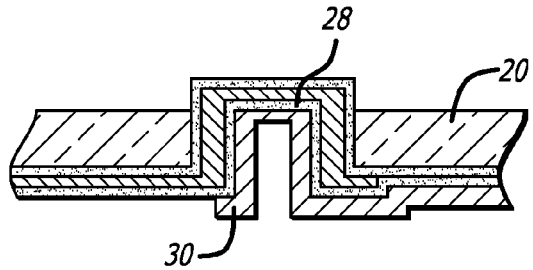
Figure 5:
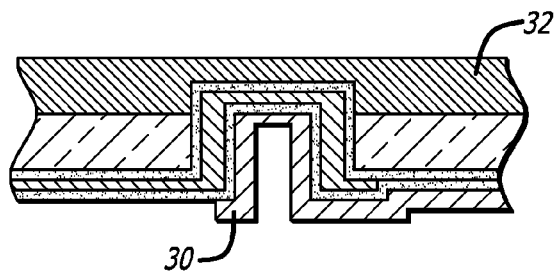
Figure 6:
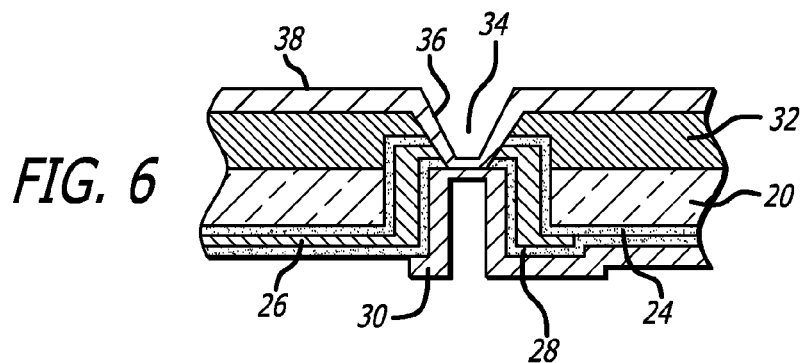

Next is to back grind the silicon wafer 20 to within approximately 5 microns of the via pillar (first copper layer 26) that will form the coaxial conductor as shown in FIG. 3. Then a dry etch is used to reduce the thickness of this silicon substrate 20 by approximately 15 microns to expose approximately 10 microns of the via pillar (oxide layer 24), as shown in FIG. 4. Then approximately 20 microns of oxide 32 is deposited and planarized using CMP (chemical mechanical polishing), as shown in FIG. 5. Then, as shown in FIG. 6, the via 34 is etched through the oxide, the first copper layer 26 and oxide layer 28 to the inner copper layer 30, which will be the center conductor of the coaxial feedthrough. This etch may be a liquid etch, as vertical sidewalls are not necessary, and actually are not preferred. This etch will be through oxide layer 32, oxide layer 24, copper layer 26 and oxide layer 28 to stop on the copper layer 30. Then approximately 1-2 microns of oxide 38 is deposited to isolate the shield copper of layer 26 from the copper inner conductor formed by layer 30.

Figure 7:
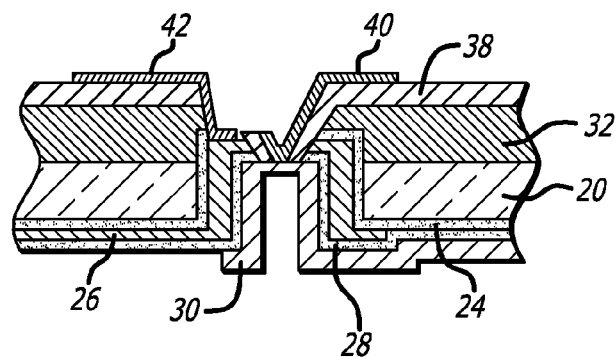
Figure 8:
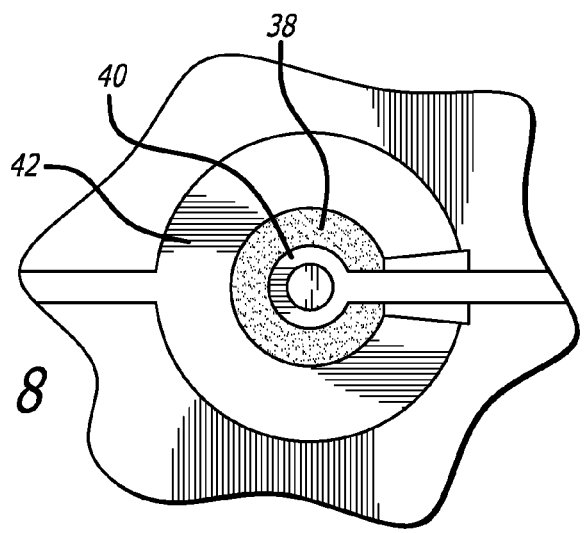
FIG. 8 is a top view of the coaxial feedthrough of FIG. 7.

Then, as shown in FIG. 7, openings are etched in oxide layers 38 and 32 to separately expose both the first copper layer 26 and the second copper layer 30, and a layer of copper is deposited and patterned to form electrical contacts 40 and 42 for what is now the center conductor 30 and the coaxial shield conductor 26. Preferably but not necessarily, the connection between contact 42 and the copper layer 26 may extend over a nearly the full circle of copper layer 26, interrupted only by an opening for the contact 40, as shown in FIG. 8.

Thus patterned metal layer 30 forming the center conductor and contact is accessible from one side of the wafer 20, and both the center conductor contact and the coaxial conductor contact are accessible from the opposite side of the substrate. Generally the outer conductor of the coax is grounded from one end (or one side of the substrate), though contact could be made to the outer conductor 26 of the coax on both sides of the substrate if desired.

Figure 9:
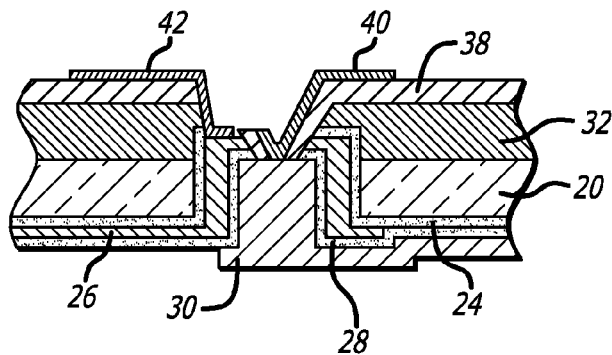
FIG. 9 is a cross section similar to FIG. 7 showing a coaxial feedthrough in accordance with FIG. 7, though with the recess in the substrate being entirely filled.

The embodiment just described is referred to as a metal lined TSV (through silicon via). As previously mentioned, the center copper layer may entirely fill the center region, in which case the metal filled TSV of FIG. 9 results.

As an alternative, one can use a pillar process. A pillar process is a process wherein the substrate on which the pillars are to be formed is coated with a photoresist and then exposed, after which the photoresist in the regions defining where the pillars are to be formed is removed, exposing the areas of the substrate, typically conductive contacts for circuits on the substrate or perhaps other pillars formed on the other substrate. Then a conductor such as copper (though other metals can be used) is electroplated through the pillar openings in the photoresist so that the conductive pillars are electroplated onto the contacts on the substrate. The free standing pillars are then encapsulated in a plastic, typically an epoxy, and the surface thereof is planarized at least down to the tops of the conductive pillars so that the tops of the conductive pillars are now exposed for making further contact, either with a circuit board, typically using solder ball connections, or for connection to contacts on another substrate in a stacked assembly.

The foregoing prior art process is altered in accordance with the present invention in that the mask through which the photoresist on the substrate is exposed defines not only the copper pillars which form the through conductors, but also defines the conductive region that is coaxial with the pillars so that when the pillars are formed by the electroplating process, the coaxial conductors are simultaneously formed so that no additional processing steps are required to obtain the coaxial feedthroughs in comparison to the individual pillars.

Figure 10:
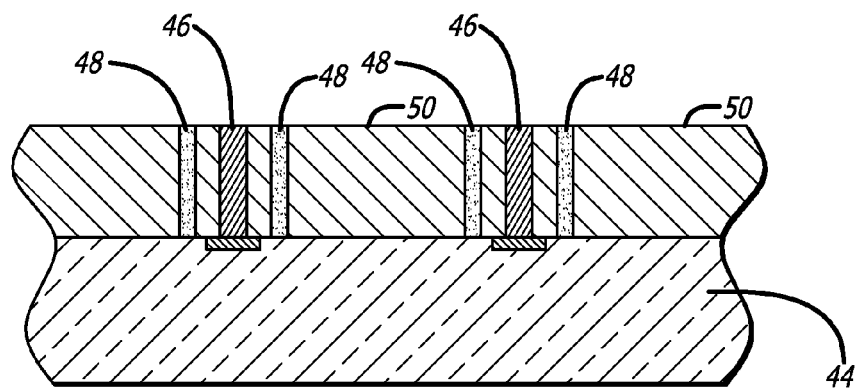
FIG. 10 is an illustration of a pair of coaxial feedthroughs formed by using a modification of a pillar process.
Figure 11:
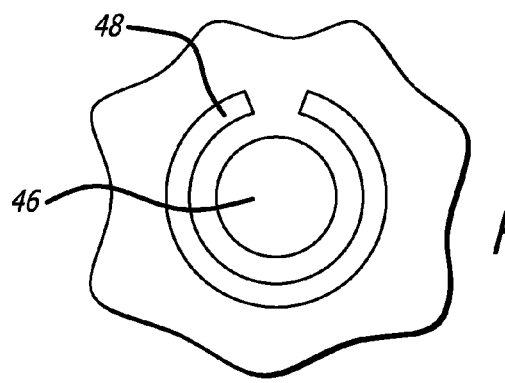
FIG. 11 is a possible top view of a coaxial feedthrough in accordance with FIG. 10 taken on an enlarged scale.

The result is shown in FIG. 10, wherein a section of a silicon chip 44 is shown with not only the pillar type central conductors 46, but also the circular or tubular coaxial conductors 48, which together form the coaxial feedthrough. The central pillars 46 and the coaxial conductors 48 are embedded in an epoxy or other plastic layer 50 which has been planarized to a level exposing the tops of the pillars 46 and the coaxial conductors 48. Thus the epoxy itself forms the insulator between the central conductor and the coaxial conductor, which can be selected to have low losses. In the earlier embodiment, the corresponding insulator was formed by the second oxide layer 28.

Note that the coaxial conductors 48 may be a full circular or tubular conductor, or alternatively, may not be fully circular but instead have a local slot down the otherwise coaxial conductor. The purpose of such a slot is to allow making electrical connection to both the central conductor 46 and the coaxial conductor 48 through a single patterned conductive layer without any insulative layers therebetween.

Figure 12:
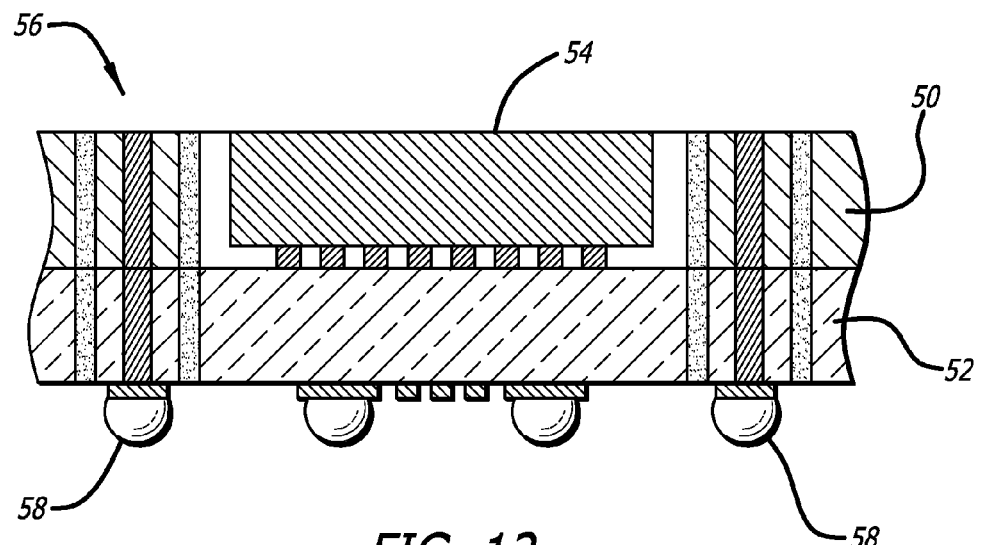
FIG. 12 is a cross section of stacked substrates showing the use of coaxial feedthroughs in accordance with the present invention.

Now referring to FIG. 12, a cross section of a portion of a device stacked on a core substrate 52 may be seen. As schematically shown therein, an integrated circuit 54, typically with a thinned substrate, is mounted on the core substrate 52 with the coaxial feedthroughs generally indicated by the numeral 56 for electrically coupling the solder balls 58 to the elevation of the top of the integrated circuit 54 for making contact therewith, or possibly for electrically connecting to a second integrated circuit to be stacked thereabove. If the lower center conductors 46 and coaxial shield 48 are to be joined to the upper elements of what amounts to a stacked coaxial feedthrough, the same may be done in a number of ways, including diffusion bonding and eutectic bonding, by way of example.

Thus the present invention provides for the fabrication of coaxial feedthroughs using through silicon technology, Cu pillar technology and plastic embedded laminate technology, effectively shielding every through via from each other and from the substrate. It eliminates problems of cross talk experienced with simple prior art package feedthrough technology, and allows the feedthrough technology to be used with low resistivity and substrates without fear of electrical crosstalk at high frequencies. The coaxial feedthroughs of the present invention completely isolate vertical TSV feedthroughs from each other and any surrounding lossy substrate, substantially eliminating undesired crosstalk between TSVs to preserve signal integrity.

From a manufacturing standpoint, the processes for forming the coaxial feedthroughs only adds four more steps compared to a non coaxial TSV process of the first embodiment. For the pillar process embodiment, there are no extra process step. Also the entire process may be carried out at under 400° C., which makes it compatible with active Si substrates as well as passive interposer type substrates. Thus the coaxial feedthroughs are easily integratable and manufacturable and leave no through open hole, which is important for wafer processing through a fab process.

The present invention is highly useful in 3D panel level and chip stacking assembly technologies that are being developed. All such technologies have vertical feedthroughs through the laminate for redistributing signal and power lines. Coaxial feedthroughs prevent coupling between the feedthroughs. In lossy laminates like FR4 material, the coaxial feedthroughs prevent noise coupling by capacitive and resistive paths.

In the prior description of the preferred embodiments, the plated regions were identified as copper plated regions, though other conductive materials may also be used, such as silver, gold or doped poly silicon for the plated regions. Similarly, the insulative layers were identified as oxide layers, though specific insulative material that may be used include silicon oxide layers, silicon nitride layers, aluminum oxide layers and polymeric layers.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A method of making coaxial feedthroughs in a substrate comprising:
    a) forming a depression in the substrate;
    b) depositing a first insulative layer;
    c) depositing a first conductive layer;
    d) depositing a second insulative layer;
    e) depositing a second conductive layer;
    f) thinning the substrate to expose the first insulative layer;
    g) depositing a third insulative layer;
    h) forming an opening through the third and first insulative layers, the first conductive layer and the second insulative layer to expose an area of the second conductive layer;
    i) depositing a fourth insulative layer;
    j) removing portions of the fourth insulative layer to expose an area of the second conductive layer;
    k) depositing and patterning a third conductive layer to define a first electrical connection to the first conductive layer and a second electrical connection to the second conductive layer.

2. The method of claim 1 wherein the substrate is a silicon substrate.

3. The method of claim 1 wherein the conductive layers are selected from the group consisting of copper layers, silver layers, gold layers and doped poly silicon layers.

4. The method of claim 1 wherein the insulative layers are selected from the group consisting of silicon oxide layers, silicon nitride layers, aluminum oxide layers or polymeric layers.

5. The method of claim 1 wherein the depression of a) has substantially parallel sidewalls.

6. The method of claim 1 wherein the second conductive layer does not fill the depression of a).

7. The method of claim 1 wherein the second conductive layer does fills the depression of a).

8. The method of claim 1 further comprised of mounting an integrated circuit to the substrate, wherein the a face of the integrated circuit opposite the substrate is level with the exposed tops of the plated regions.

9. The method of claim 8 wherein the integrated circuit has a thinned substrate.

10. A method of making coaxial feedthroughs comprising:
   a) coating a substrate with a layer of photoresist and exposing the photoresist to a pattern defining coaxial conductor regions;
   b) developing the photoresist to form openings in the photoresist to expose regions of the substrate defining where the coaxial conductors will be formed;
   c) electroplating through the openings to form plated regions defining at least one conductive pillar on the substrate and a conductive region coaxial with the conductive pillar;
   d) removing the photoresist around the plated regions;
   e) encapsulating the plated regions with a plastic material or oxide;
   f) planarizing a surface of the plastic material or oxide to expose the tops of the plated regions.

11. The method of claim 10 wherein the plated regions are regions selected from the group consisting of copper plated regions, silver plated regions, gold plated regions and doped poly silicon plated regions.

12. The method of claim 10 wherein the conductive region coaxial with the conductive pillar is a closed circular conductive region.

13. The method of claim 10 wherein the conductive region coaxial with the conductive pillar is a circular conductive region with a slot therein.

* * * * *